(12) United States Patent
Aoyama et al.

(10) Patent No.: US 7,432,674 B2
(45) Date of Patent: Oct. 7, 2008

(54) CONTROL SYSTEM

(75) Inventors: Kazunari Aoyama, Yamanashi (JP);
Kunitaka Komaki, Yamanashi (JP);
Minoru Nakamura, Fujiyoshida (JP);
Takaaki Komatsu, Yamanashi (JP)

(73) Assignee: Fanuc Ltd., Yamanashi (JP)

( * ) Notice: Subject to any disclaimer, the term of this patent is extended or adjusted under 35 U.S.C. 154(b) by 155 days.

(21) Appl. No.: 11/366,432

(22) Filed: Mar. 3, 2006

(65) Prior Publication Data

US 2006/0197476 A1 Sep. 7, 2006

(30) Foreign Application Priority Data

Mar. 4, 2005 (JP) ............................. 2005-060863

(51) Int. Cl.
*H02P 5/46* (2006.01)
(52) U.S. Cl. .......................... 318/85; 318/34; 318/68; 318/54; 318/41
(58) Field of Classification Search ............... 318/85, 318/41, 52, 68, 34, 54
See application file for complete search history.

(56) References Cited

U.S. PATENT DOCUMENTS

| | | | | |
|---|---|---|---|---|
| 4,208,635 | A * | 6/1980 | Fazakerly et al. | 331/17 |
| 5,555,140 | A * | 9/1996 | Kitamura et al. | 360/73.02 |
| 5,850,338 | A | 12/1998 | Fujishima | |
| 6,274,997 | B1 * | 8/2001 | Shiba et al. | 318/700 |
| 6,326,747 | B1 * | 12/2001 | Shiba et al. | 318/85 |
| 6,417,643 | B1 * | 7/2002 | Shiba et al. | 318/700 |
| 6,526,889 | B2 * | 3/2003 | Tokiwa | 101/485 |
| 6,603,830 | B1 * | 8/2003 | Finsterbusch et al. | 375/362 |

FOREIGN PATENT DOCUMENTS

| | | |
|---|---|---|
| EP | 0928108 | 7/1999 |
| EP | 1653651 | 5/2006 |
| JP | 56046266 | 4/1981 |
| JP | 2-285404 | 11/1990 |
| JP | 4-135210 | 5/1992 |
| JP | 9-160630 | 6/1997 |
| JP | 2000-20119 | 1/2000 |
| JP | 2001-331222 | 11/2001 |

OTHER PUBLICATIONS

European Search Report, dated Aug. 9, 2006, for related European Patent Application No. EP 06 25 0970 cites AA, AB, AC, AG, AH and AI.
Search Report, dated Aug. 9, 2006, in a corresponding European Patent Application.
Japanese Patent Office Action, mailed Jun. 3, 2008 and issued in corresponding Japanese Patent Application No. 2005-060863.

* cited by examiner

*Primary Examiner*—Rita Leykin
(74) *Attorney, Agent, or Firm*—Staas & Halsey LLP

(57) ABSTRACT

A transmission path delay is set in a shift setting register. A slave unit generates a PRE_ITP signal in response to a timing signal (ITP signal) issued by a master unit. The phase difference between this PRE_ITP signal and the ITP signal unique to the slave unit is loaded into a period modification counter. A timer corrects a reference value, outputs position/speed control period signals (SYN signals) and counts down the period modification counter with these SYN signals until the period modification counter reaches zero. Furthermore, the ITP signal unique to the slave unit is outputted every time a predetermined number of the SYN signals are outputted.

6 Claims, 8 Drawing Sheets

CONTROL SYSTEM

BACKGROUND OF THE INVENTION

1. Field of the Invention

The present invention relates to the synchronous operation of motors that are controlled by a control apparatus such as a numerical control apparatus or a robot controller.

2. Description of the Related Art

In a control apparatus such as a numerical control apparatus or a robot controller, motor control is performed on the basis of a timing signal (ITP (interpolation period) signal) generated by the internal hardware of the control apparatus at a constant frequency, and the main CPU of the control apparatus delivers the movement at each interval of the ITP signal to DSPs (digital signal processor) which control servo motors. The DSPs control the positions and speeds of the motors by distributing the commanded movement among control periods (position/speed control periods) obtained by dividing the ITP signal interval into further equal parts.

The motors move in synchronization with the ITP signal, and hence motors controlled by a single control apparatus can perform a closely synchronized operation. This is because the motors can use the same ITP signal.

However, when a large number of motors are to be controlled, the axis control slots possessed by a single control apparatus are insufficient, and in certain cases, another control apparatus must be used. In such cases, motors that are controlled by the same control apparatus are able to use the same ITP signal, as described above, and are therefore capable of a closely synchronized operation. However, ITP signals are not synchronized among motors that are controlled by different control apparatuses, and hence the motors cannot perform a synchronous operation.

In a known method for solving this problem to enable synchronous operation among motors controlled by a plurality of control apparatuses, the plurality of control apparatuses are divided into a single master unit and one or more slave units, and ITP signals are distributed to the slave units from the master unit via a serial bus connecting the master unit and slave units. Thus the ITP signals of the plurality of control apparatuses are synchronized such that the motors controlled by the plurality of control apparatuses perform a synchronous operation. In addition to the ITP signals, information required for the synchronous operation, such as the movement for each ITP interval, is transmitted and received on the serial bus. With this synchronization method, delays caused by the length of the transmission line between the master unit and the slave units and so on lead to deviations in the synchronization signal (ITP signal) generation timing, and hence a technique has been developed for correcting these deviations such that the ITP signals are generated at an identical timing (see Japanese Patent Application Laid-Open No. 4-135210).

Note that ITP signals may be transmitted and received using a dedicated cable, but information required for the synchronous operation other than the ITP signal must be transmitted and received, leading to an increase in the number of serial bus lines and a consequent increase in cost.

Furthermore, by applying this method to expansion slots connected to the same serial bus, the number of axes can be increased as long as the CPU of the control apparatus can manage. More specifically, the ITP signals of the master unit are transmitted on the serial bus to an axis control board mounted in the expansion slot, the ITP signals inputted into the axis control board are synchronized, and the movement for each ITP signal is outputted to the DSPs on the axis control board simultaneously through the serial bus.

FIG. 1 shows an outline of synchronous control of motors connected to a numerical control apparatus serving as the aforementioned master unit, to an axis control board provided in an expansion slot of the master unit, and to numerical control apparatuses serving as slave units. In FIG. 1, the serial bus between the numerical control apparatuses and expansion slot takes a cascade connection form, but may take a star form, a multidrop form, or another form.

FIG. 9 is an illustrative view showing ITP signal transmission and reception between the master unit and slave units of the control system shown in FIG. 1. When an ITP signal is generated in the master unit (FIG. 9(a)) of a control system in which the master unit and a slave unit (including the axis control board provided in the expansion slot of the master unit), constituted by numerical control apparatuses, are connected by a serial bus such that the motors controlled by the respective numerical control apparatuses can be synchronously controlled, notification of the generation of the ITP signal is transmitted automatically from the master unit to the slave unit through the serial bus (FIG. 9(b)). The transmitted notification comprises digital information indicating that an ITP signal has been generated. The slave unit receives the ITP signal (FIG. 9(c)), decodes the digital information, and generates a PRE_ITP signal, which is a signal indicating that an ITP signal has been generated in the master (FIG. 9(d)).

The PRE_ITP signal is delayed in relation to the ITP signal from the master unit, but as long as this delay is negligible, it may be used without modification as the ITP signal of the slave unit, enabling synchronous operation of the motors controlled by the master unit and slave unit. Even if a delay exists, the delay can be corrected using the method described in the above-mentioned Japanese Patent Application Laid-Open No. 4-135210.

However, if the PRE_ITP signal is used as the ITP signal of the slave unit and the ITP signal transmission timing changes due to interference with the transmission of normal data or the like, the PRE_ITP signal interval may change greatly. Furthermore, if a communication failure occurs due to noise or the like such that the ITP signal generation information does not reach the slave unit, the slave unit can issue a request for retransmission to ensure that the ITP signal is received, but as a result of the retransmission, a deviation occurs in the ITP signal timing, causing an increase in the synchronization error between the motors.

FIG. 10 is an illustrative view of this phenomenon. An ITP signal is generated in the master unit (FIG. 10(a)), and an ITP transmission signal S is transmitted automatically from the master unit to the slave unit to notify the slave unit that an ITP signal has been generated. However, due to a communication failure or the like, the ITP transmission signal S does not reach the slave unit, and when the ITP transmission signal is retransmitted (FIG. 10(b)), the retransmitted ITP transmission signal Sr is delayed. Hence, when the slave unit receives the retransmitted ITP transmission signal Sr, the PRE_ITP signal generated as a result is also delayed (FIG. 10(c)).

As a result, a deviation occurs in the timing of a DSP control period, which is a control period of the position and speed of the motors obtained by dividing the PRE_ITP signal interval into further equal parts. As shown in FIG. 10(d), due to the delay in the PRE_ITP signal caused by the delay in the retransmitted ITP transmission signal Sr, the control period immediately before generation of the PRE_ITP signal becomes a period T1 which is longer than normal. On the other hand, when the next ITP signal is generated, the ITP transmission signal S is received normally and the PRE_ITP signal is generated normally, and hence the final control period (position/speed control period) of the counter periods obtained by dividing the interval between the delayed PRE_ITP signal and the normal PRE_ITP signal becomes a period T2 which is shorter than normal.

A deviation also occurs in the ITP signal timing due to differences in the clocks installed in the master unit and slave units. A timing deviation indicates that the ITP signal interval is irregular, and since the ITP signal interval is divided further to perform motor position/speed control, the timing deviation leads to irregular position/speed control.

SUMMARY OF THE INVENTION

The present invention relates to a control system in which a single control apparatus serving as a master unit and one or more control apparatuses serving as slave units are connected by a serial bus, for performing synchronous control of motors controlled by these different control apparatuses. In this control system, each slave unit includes correcting means. The correcting means are constituted by a part for obtaining a phase difference between a timing signal transmitted by the master unit and received by the slave unit, and a timing signal generated by the slave unit, a part for obtaining, from the phase difference, a correction amount for aligning the timing signal on the slave unit side with the timing signal on the master unit side, and a part for correcting the timing signal generation period of the slave unit in accordance with the correction amount. The timing signal corrected by the correcting means is then outputted.

The control apparatuses serving as the slave units may include an axis control board mounted in an expansion slot of the control apparatus.

The correcting means may comprise: a phase comparator for determining the phase difference between the timing signal transmitted by the master unit and received in the control apparatus serving as the slave unit, and the timing signal generated by the slave unit; a period modification register; correction amount generating means constituted by adding means for obtaining the correction amount by adding together an output of the phase comparator and a value stored in the period modification register; and signal generating means for correcting the timing signal generation period on the basis of the correction amount generated by the correction amount generating means, and generating the timing signal.

The correction amount generating means may further comprise a shift setting register in which a value for correcting a timing signal transmission delay from the master unit to the slave unit is set, and the adding means obtains a correction value by adding together the output of the comparator, the value stored in the period modification register, and the value of the shift setting register.

The correction value, which is the output of the adder, may be loaded into the period modification register to update the period modification register.

The correction amount generating means may further comprise filtering means, and the correction amount is determined in accordance with a plurality of added values outputted from the adding means, a plurality of phase differences outputted from the phase comparator, or a plurality of values stores in the period modification register.

The filtered value outputted from the adding means may be loaded into the period modification register.

The filtered valued outputted from a phase comparator may be inputted into a adding means.

The signal generating means may be constituted by a period modification counter and a timer, a correction value, which is the output of the adding means, is loaded into the period modification counter, a period modification command and a sign signal of the loaded correction value are outputted to the timer until a number of position/speed control period signals outputted from the timer matches the value loaded in the counter, and the timer corrects a reference time period using the inputted period modification command and sign signal, outputs the position/speed control period signal, and outputs the timing signal every time the position/speed control period signal reaches a predetermined number.

In case where output of the adder has been calculated and processed by a filter, the calculated value may be loaded in the period modification register so as to be updated.

In the case where output of the phase comparator has been calculated and processed by a filter, the calculated value may be loaded as an input to the adder.

The control system according to the present invention has the constitution described above, and therefore, timing signal deviations caused by a communication failure or the like between a master unit and a slave unit can be corrected automatically to achieve synchronization. Moreover, deviations in the timing signal of the slave unit due to the communication path length and so on can be corrected such that the slave unit achieves synchronization with the timing signal of the master unit.

BRIEF DESCRIPTION OF THE DRAWINGS

The above and other objects and features of the present invention will be clarified in the following description of the embodiments with reference to the attached drawings, in which:

FIG. 7 is a timing chart of an operation performed by the correcting means of FIG. 2 when a timing signal deviation occurs due to a transmission line delay or the like;

FIG. 8 is a timing chart of an operation performed by the correcting means of FIG. 5 when a timing signal deviation occurs due to a transmission line delay or the like;

DETAILED DESCRIPTION OF THE PREFERRED EMBODIMENTS

Figure 1:
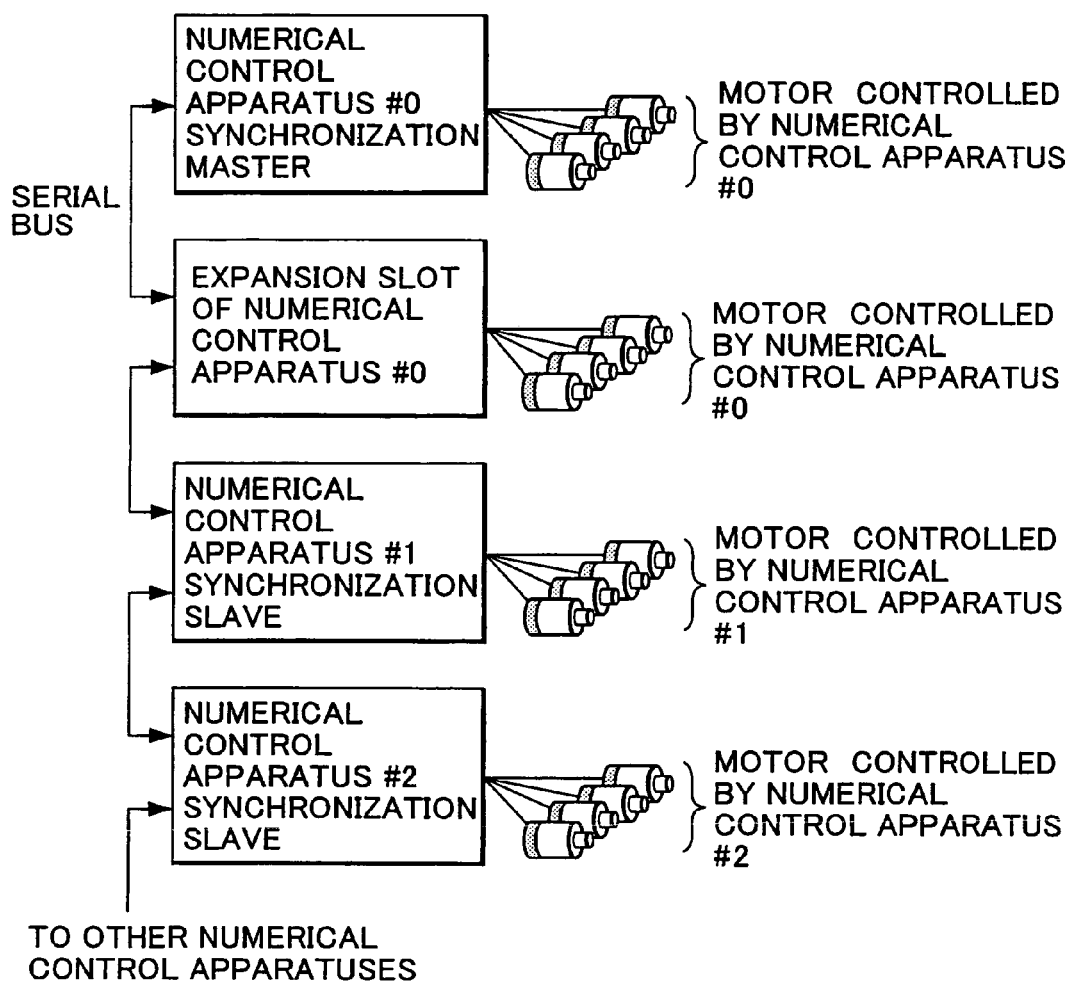
FIG. 1 is a block diagram illustrating an outline of an embodiment of a control system according to the present invention.

FIG. 1 shows an embodiment of a control system according to the present invention which is, in outline, identical to a conventional control system. In the embodiment shown in FIG. 1, a plurality of numerical control apparatuses are connected through a serial bus in order to perform synchronous control. Numerical control apparatuses #1, #2, . . . serving as slave units are connected to a numerical control apparatus #0 serving as a master unit through by the serial bus. A motor controlled by an axis control board mounted in an expansion slot of the master unit is also controlled in synchronization with the other motors, and hence the present invention is also applied to this axis control board mounted in the expansion slot, which serves as a slave unit.

Figure 2:
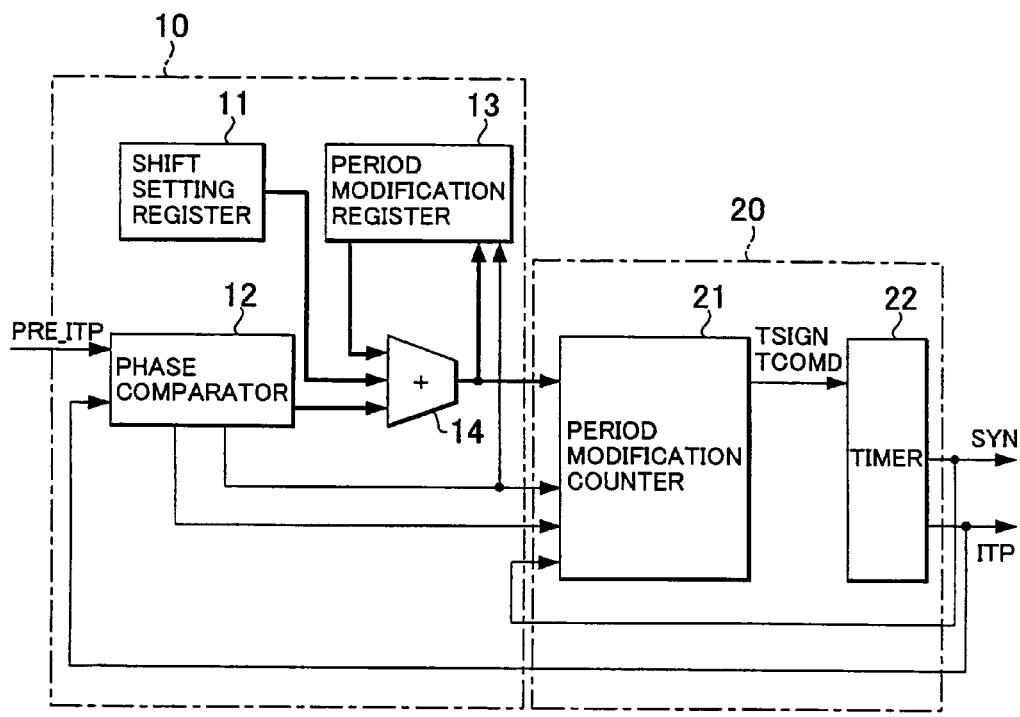
FIG. 2 is a block diagram showing a first embodiment of correcting means for correcting a timing signal in this embodiment of the control system according to the present invention.

A feature of the present invention is that each of the slave units (the numerical control apparatuses #1, #2, . . . and the axis control board mounted in the expansion slot of the master unit) is provided with correcting means (i.e., a correcting unit) for correcting a timing signal (ITP signal) deviation, in the control system, and another feature of the present invention is that the slave unit generates an ITP signal that is unique to the slave unit in addition to a PRE_ITP signal. FIG. 2 is a block diagram showing a first embodiment of the correcting means (i.e., the correcting unit).

The correcting means for correcting the timing signal deviation is constituted by correction amount generating means 10, and signal generating means 20 for generating a timing signal (ITP signal) by correcting the generation period of the timing signal (ITP signal) on the basis of the correction amount generated by the correction amount generating means 10.

The correction amount generating means 10 is constituted by a shift setting register 11, a phase comparator 12, a period modification register 13, and an adder 14. The shift setting register 11 corrects fixed delays occurring between the master unit and slave unit due to delays caused by the serial bus cable and so on. A fixed value corresponding to the delay is set in the shift setting register 11, and the timing signal (ITP signal) generation timing of the slave unit is brought forward in accordance with the fixed value.

The phase comparator 12 compares the phase difference between the PRE_ITP signal, which is generated by the slave unit in response to a notification of the generation of an ITP signal from the master unit, and the corrected ITP signal. If the PRE_ITP signal is generated later than the ITP signal, the phase comparator 12 detects "+", and if the ITP signal is generated earlier than the PRE_ITP signal, the phase comparator 12 detects "−". The phase comparator 12 also measures the interval between the two ITP signals (the PRE_ITP signal and corrected ITP signal) using a counter for detecting a phase difference, and outputs a timing control signal (ITPC) at the arrival point of the later of the two ITP signals.

The period modification register 13 holds a correction amount for aligning the ITP signal unique to the slave unit with the PRE_ITP signal. More specifically, when the ITPC signal (timing control signal) from the phase comparator 12 has been asserted, the period modification register 13 stores and updates the output (correction amount) of the adder 14.

The adder 14 adds together the value of the shift setting register 11, the phase difference determined by the phase comparator 12, and the correction amount relating to the previous ITP signal, which is stored in the period modification register 13, and outputs a correction amount relating to the current ITP signal. Once the ITPC signal has been asserted, the output (correction amount) of the adder 14 is loaded into a period modification counter 21 of the signal generating means 20, and also loaded into the period modification register 13, as described above, to be updated and held therein.

The signal generating means 20 are constituted by the period modification counter 21 and a timer 22. The output (correction amount) of the adder 14 is loaded into the period modification counter 21 once the ITPC signal outputted from the phase comparator 12 has been asserted. The loaded correction amount is counted down in SYN signals generated in each position/speed control period, and when the count value has reached zero, the countdown is stopped. A ± sign (TSIGN) and a period modification command (TCMD) are outputted to the timer 22 until the count value reaches zero.

The timer 22 generates a SYN signal by counting input clock signals. The SYN signal is aperiodic signal, and when the SYN signal has been generated a predetermined number of times, the ITP signal unique to the slave unit is generated. When the phase deviation between the PRE_ITP signal and the unique ITP signal is zero, the period of the SYN signal (position/speed control period signal) is constant, and the integral multiple of the SYN period serves as the ITP signal period. In the DSP which controls the motor, position/speed control of the motor is performed on the basis of the SYN signal. Accordingly, large variation in the interval thereof leads to variation in the motor speed, which is undesirable.

When the period modification command (TCMD) outputted by the period modification counter 21 is in ON-state, the SYN signal period is increased or decreased by a unit amount (1) from the value of a default k. Whether the SYN signal period is increased or decreased is determined by the sign (TSIGN), which is likewise outputted from the period modification counter.

Next, an operation of the correcting means for correcting the ITP signal generation will be described.

When the PRE_ITP signal and ITP signal are generated, the phase difference between the two signals is counted by the phase comparator 12, and the ITPC signal is generated, the output of the adder 14 (a value (correction amount) obtained by adding together the value of the shift setting register 11, the value set in the period modification register 13, and the phase difference between the PRE_ITP signal and ITP signal counted by the phase comparator 12) is loaded into the period modification register 13 and the period modification counter 21 of the signal generating means 20. In the period modification counter 21, the loaded value is counted down upon each SYN signal generation, and the period modification command TCMD and the TSIGN signal indicating the phase difference sign are outputted as shown in FIGS. 3(a) and 3(b) until the count value reaches zero.

Figure 3:
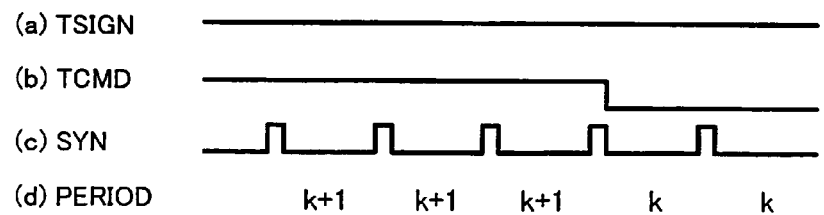
FIG. 3 is a timing chart of an operation performed by signal generating means provided in the correcting means of FIG. 2.

While the period modification command TCMD is being outputted to the timer 22 from the period modification counter 21, the timer 22 increases or decreases the SYN signal generation period from the value of the default k in accordance with the TSIGN signal indicating the sign, as shown in FIGS. 3(c) and 3(d), and outputs the SYN signal generation period. When the SYN signal has been generated a predetermined number of times, the ITP signal is generated, and since the SYN signal period increases and decreases, the ITP signal period also increases and decreases. Variation in the SYN signal period is normally limited to ±1 (or ± unit amount), and therefore the effect of this variation on the motor speed is minor.

As a result of the increase or decrease in the ITP signal period, the ITP signal phase is advanced or retarded, and thus the phase difference between the ITP signals of the master unit and slave unit can be reduced. If the sum total of the phase difference (the output of the phase comparator 12) upon generation of the next ITP signal and the set value of the shift setting register 11 is zero, the value loaded into the period modification register 13 on the previous occasion is reloaded into the period modification counter 21 this time, and as a result, the periods of the same number of SYN signals as the previous occasion are increased or decreased.

Further, when a constant difference in oscillatory frequency exists between the source clocks of the master unit and slave unit, a constant difference in the ITP signal periods obtained by counting the source clocks also occurs between the master unit and slave unit. However, this difference is held in the period modification register 13, and may therefore be corrected.

Note that in the example described above, the value of the period modification register 13 is variable, but this value may be fixed. In this case, the generated phase difference only contributes to the increase or decrease in the next SYN signal period, which is synonymous with a phase shift. Hence, the fixed value may be added to the value to be set in the shift setting register 11, corresponding to a transmission delay caused by the communication path or the like, whereupon the sum total thereof may be set in the shift setting register 11.

The fixed value set in the shift setting register 11 is used to correct fixed delays between the master unit and slave unit, such as a delay caused by the length of the serial bus. The fixed value may be calculated from the cable length and so on and inputted as a parameter, or may be set by automatically detecting the delay between the master unit and slave unit through the transmission/reception of a special signal or the like.

A large fluctuation of correction value due to abrupt change in phase differences can be restrained by applying a filtering processing to the phase difference from the phase comparator, though not illustrated, thereby allowing the change in ITP caused unexpectedly by a communication failure such as noise to be further restrained.

In the first embodiment, the value inputted into the period modification register 13 is set simply as the value (correction value) obtained by adding together the output (phase difference) of the phase comparator 12, the value stored in the shift setting register 11, and the output of the period modification register 13, as described above. In this case, the ITP signal may become oscillatory.

Figure 4:
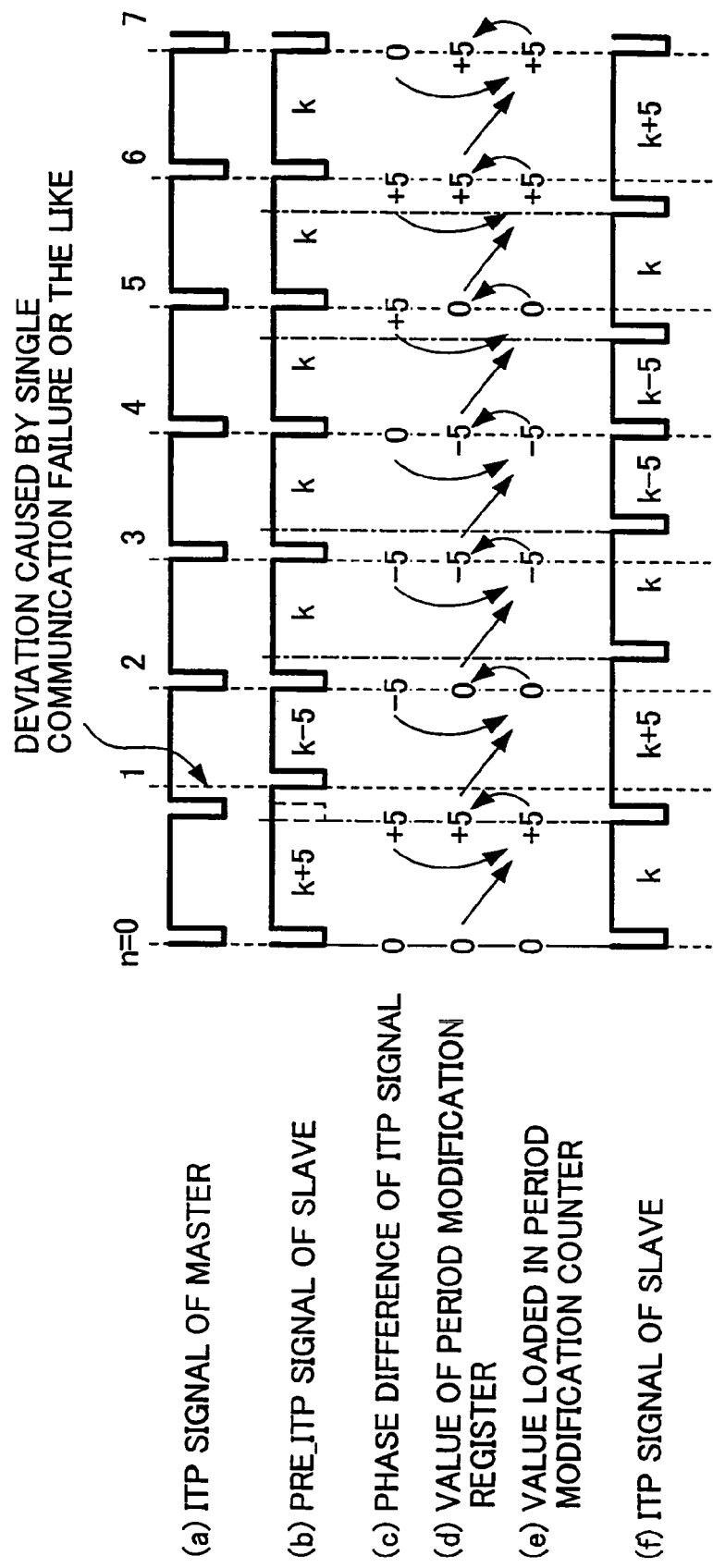
FIG. 4 is a timing chart of an operation performed by the correcting means of FIG. 2 when a timing signal deviation occurs due to a communication irregularity.

FIG. 4 is an illustrative view of the timing of an operation executed by the correcting means when, for example, the transmission path delay is negligible such that "0" is set in the shift setting register 11, there has been absolutely no previous deviation between the PRE_ITP signal and ITP signal, the outputs of both the shift setting register 11 and the phase comparator 12 are zero (n=0), and the PRE_ITP signal has deviated momentarily by +5 clocks due to a single communication failure or the like. Since the PRE_ITP signal delay in relation to the ITP signal is +5 clocks, "+5" is also set in both the period modification register 13 and period modification counter 21 (n=1), and the SYN signal period is extended by one clock five times.

As a result, assuming that the correct ITP signal interval is k clocks, the ITP signal period becomes (k+5), and the generation point of the next (n=2) ITP signal is delayed from the previous generation point by five clocks. However, the PRE_ITP signal has been delayed only once due to the previous communication failure, and therefore the PRE_ITP signal is generated five clocks earlier than the ITP signal. In other words, the ITP signal phase difference becomes "−5", but since the previous value of "+5" is stored in the period modification register 13, "0" is set in both the period modification register 13 and period modification counter 21. As a result, the ITP signal interval becomes k.

At this stage, the deviation between PRE_ITP and ITP is not yet corrected, and therefore a phase difference of "−5" occurs on the next occasion (n=3). Hence, "−5" is set in both the period modification register 13 and period modification counter 21. On the next occasion (n=4), the phase difference becomes "0", but since "−5" is set in the period modification counter 21, a phase difference of "+5" occurs on the next occasion (n=5). Thus the single phase deviation remains uncorrected.

Figure 5:
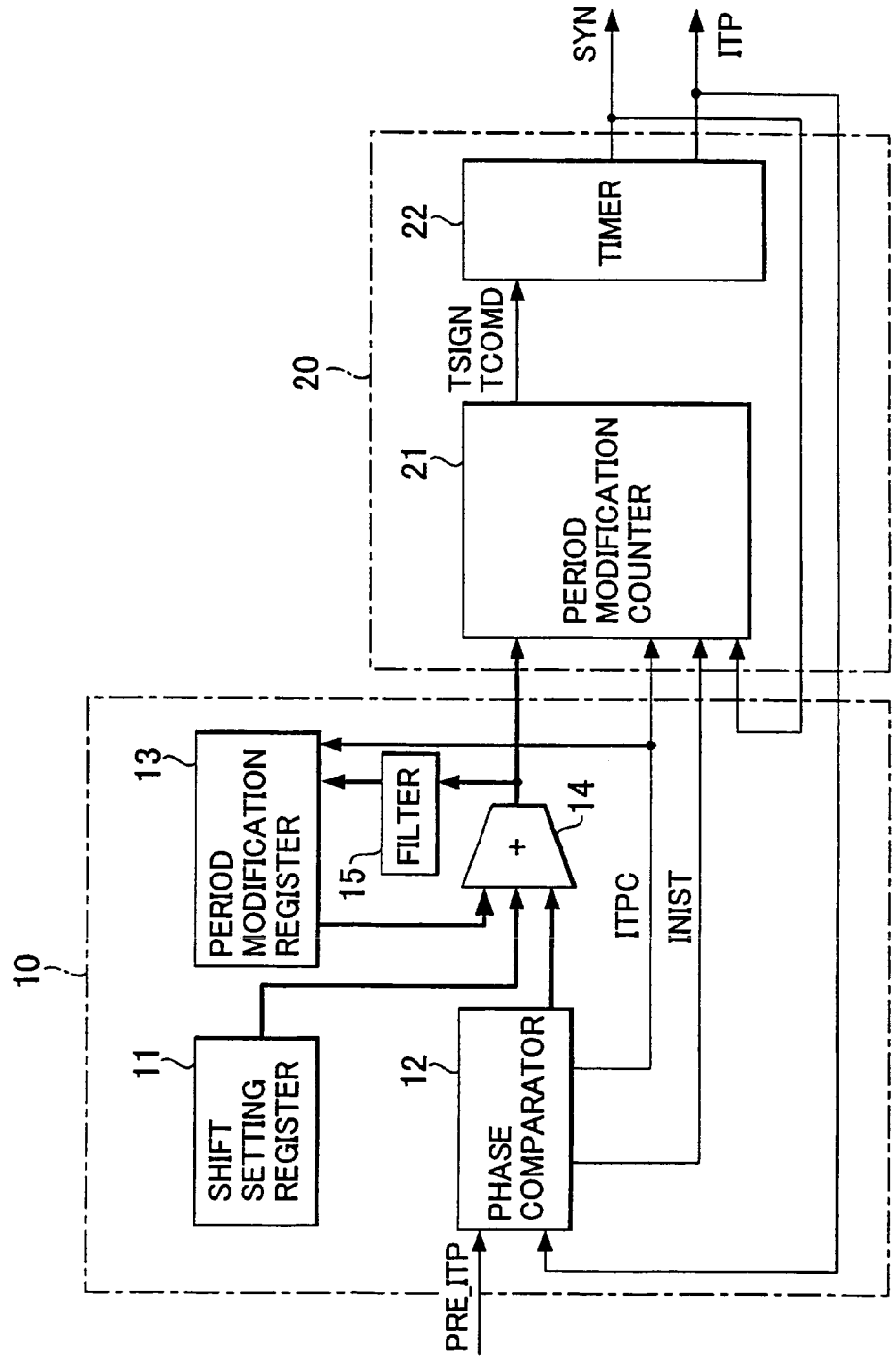
FIG. 5 is a block diagram showing a second embodiment of correcting means for correcting a timing signal in this embodiment of the control system according to the present invention.

This phenomenon is caused by a delay of control system with respect to an input, and can be prevented by inserting an appropriate filter into the circuit. For example, a moving average filter is inserted into the input portion of the period modification register. FIG. 5 shows an embodiment in which this filter is employed. A moving average is obtained by inputting the output of the adder 14 (the correction amount) into a filter 15, and storing the obtained moving average value in the period modification register 13. Apart from the filter 15, this embodiment is identical to the embodiment shown in FIG. 1. Using an example in which a filter for determining and outputting a two point moving average is employed as the filter 15, an operation of this embodiment will be described below with reference to the timing chart shown in FIG. 6.

In this case, similarly to the example described above, it is assumed that "0" is set in the shift setting register 11, there has been absolutely no previous deviation between the PRE_ITP signal and ITP signal, the outputs of the shift setting register 11 and phase comparator 12 are both zero (n=0), and the PRE_ITP signal has deviated momentarily by +5 clocks only once.

Since the PRE_ITP signal delay is "+5" in relation to the ITP signal, "+5" is set in the period modification counter 21, and the moving average value (5+0)/2=+2 (omitting decimals) of the previous output "0" of the adder 14 and the current output "5" of the adder 14 (the sum total of the phase difference "+5" of the output of the phase comparator 12 and the value "0" of the period modification register 13) is set in the period modification register 13 (n=1). Hence, the SYN signal period is extended by one clock five times in accordance with the value "5" set in the period modification counter 21.

Figure 6:
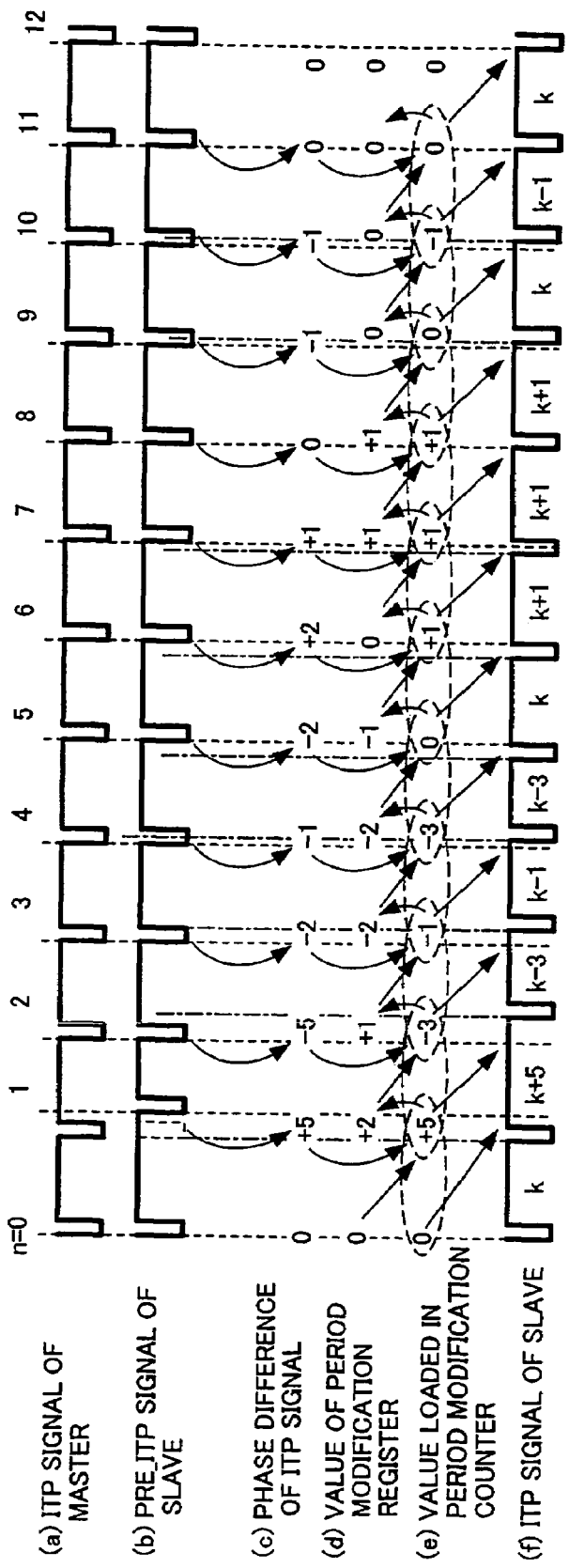
FIG. 6 is a timing chart of an operation performed by the correcting means of FIG. 5 when a timing signal deviation occurs due to a communication irregularity.

As a result, assuming that the correct ITP signal interval is k clocks, the ITP signal period becomes (k+5), and the generation point of the next (n=2) ITP signal is delayed from the previous generation point by five clocks. However, the PRE_ITP signal has been delayed only once due to the previous communication failure, and therefore the PRE_ITP signal is generated five clocks earlier than the ITP signal. In other words, the ITP signal phase difference becomes "−5". Since "+2" is stored in the period modification register 13, the adder 14 outputs −5+2=−3. Accordingly, "−3" is set in the period modification counter 21, +1, which is the average of the previous output value "+5" and the current output value "−3" of the adder 14, is stored in the period modification register 13, and the ITP signal interval becomes (k−3). This process continues in a similar manner such that at n=11, the phase difference, the value of the period modification register 13, and the value loaded in the period modification counter 21 are all 0, as shown in FIG. 6. Thus the synchronization deviation between the master unit and slave unit, generated as a result of a communication failure or the like, is eliminated. Hence, by adding a filter, it is possible to prevent the ITP signal phase difference from becoming oscillatory.

In the above operational example, an operation performed when the PRE_ITP signal deviates due to a communication failure or the like was described. Next, an operation performed when the transmission path delay is set in the shift setting register 11 will be described.

Figure 7:
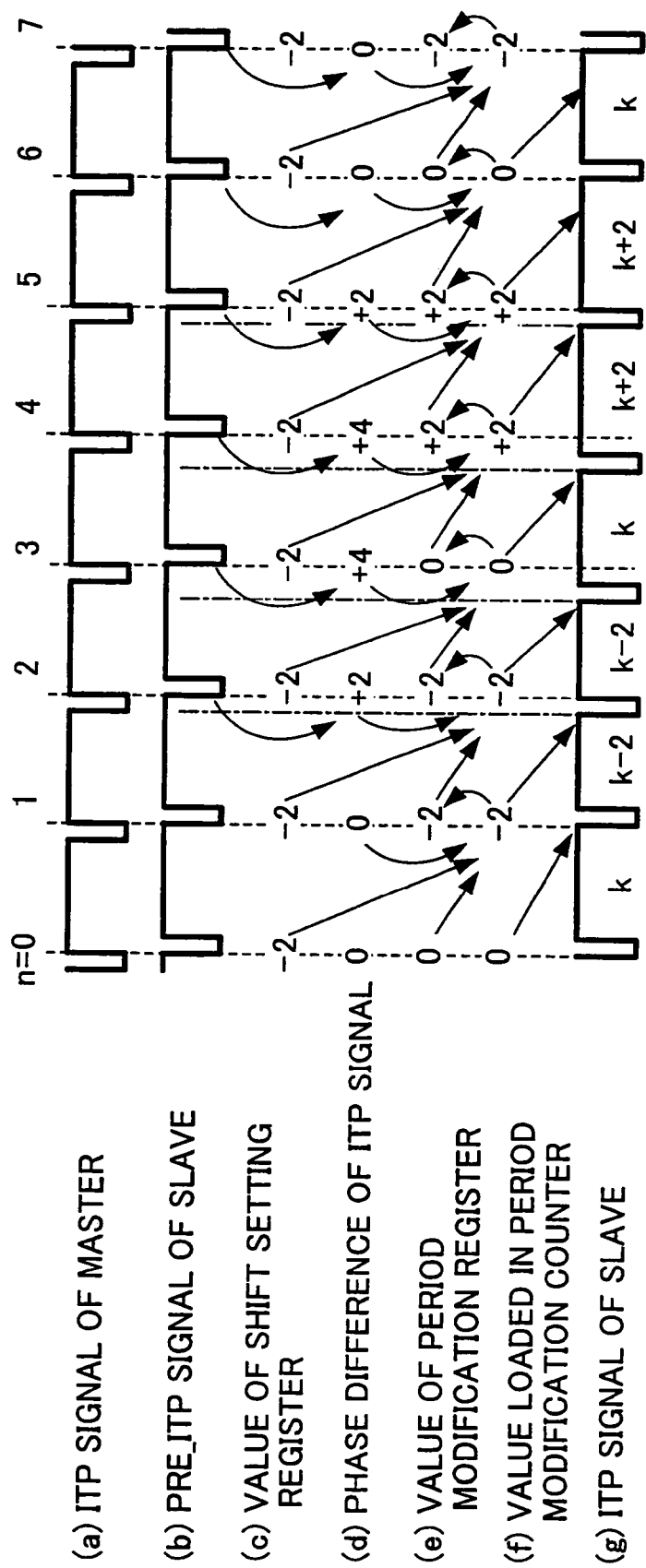

FIG. 7 is an illustrative view of an operation performed using correcting means shown in FIG. 2, which are not provided with a filter. As shown in FIG. 7, a delay corresponding to a transmission path delay or the like exists between the ITP signal of the master unit and the PRE_ITP signal of the slave unit, and "−2" is set in the shift setting register 11 as this delay. No deviation exists between the PRE_ITP signal of the slave unit, which is generated on the basis of the ITP signal issued by the master unit, and the corrected ITP signal unique to the slave unit, and therefore the phase difference is "0". Hence, "0" is set in both the period modification register 13 and period modification counter 21.

In this condition, the ITP signal is generated after the reference value of k clocks such that the phase difference between the ITP signal and PRE_ITP signal is "0". The adder 14 then adds together the value "−2" of the shift setting register 11, the output (phase difference) "0" of the phase comparator, and the value "0" of the period modification register 13, whereby an added value of "−2" is loaded into the period modification register 13 and period modification counter 21 (n=1). By loading "−2" into the period modification counter 21, the PRE_ITP signal is generated two clocks earlier than the ITP signal. In other words, the PRE_ITP signal is delayed by +2 clocks, and therefore a phase difference of "+2" is outputted from the phase comparator 12. As a result, the adder 14 adds together the value "−2" of the shift setting register 11, the value "−2" of the period modification register 13, and the output (phase difference) "+2" of the phase comparator, whereby an added value of "−2" is loaded into the period modification register 13 and period modification counter 21 (n=2).

At the generation point of the next (n=3) ITP signal, the ITP signal is generated two clocks earlier than the ITP signal interval reference value k, and therefore the PRE_ITP signal is delayed by a total of +4 clocks. Accordingly, a phase difference of "+4" is outputted from the phase comparator 12. As a result, the adder 14 adds together the value "−2" of the shift setting register 11, the value "−2" of the period modification register 13, and the output (phase difference) "+4" of the phase comparator 12, whereby an added value of "0" is loaded into the period modification register 13 and period modification counter 21 (n=3). This process is executed repeatedly thereafter such that the generation timing of the slave unit ITP signal oscillates, as shown in FIG. 7, and as a result, it becomes difficult to correct the transmission path delay in the shift setting register 11.

If correcting means employing the filter 15 shown in FIG. 5 are used, the transmission path delay can be corrected in the shift setting register 11 easily.

Figure 8:
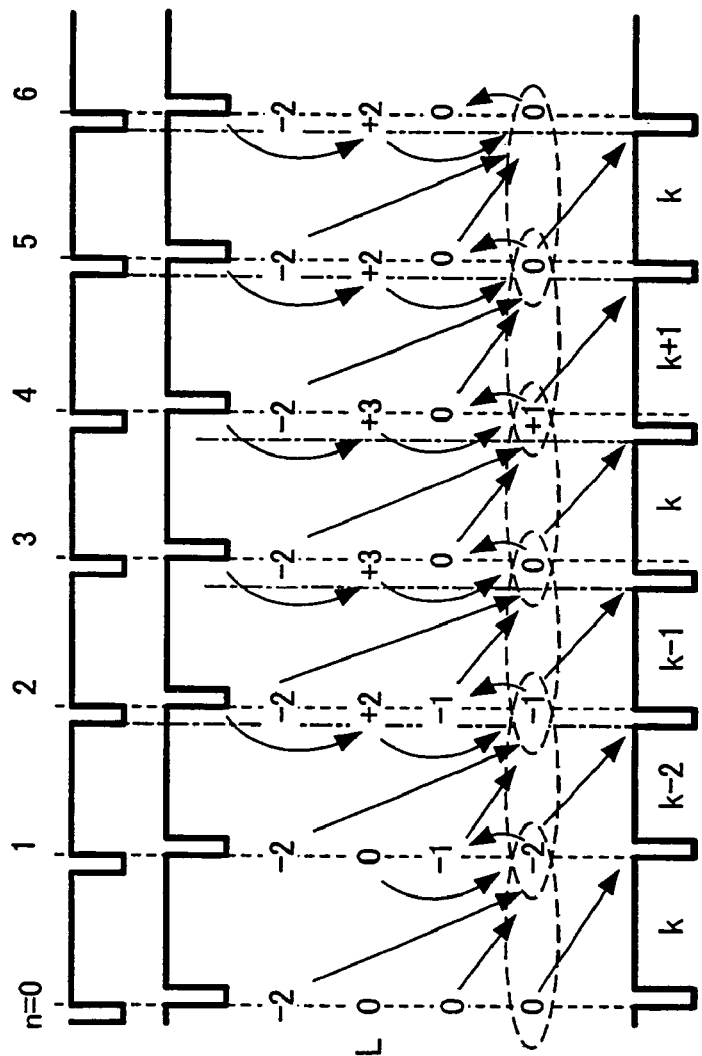
Figure 9:
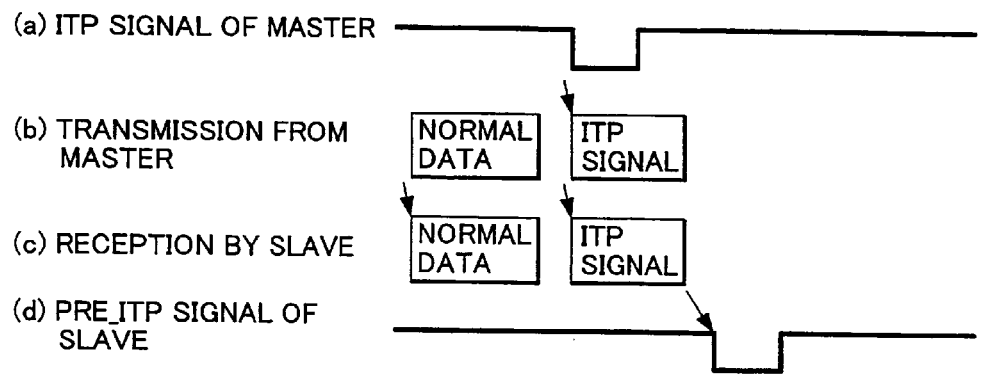
FIG. 9 is a timing chart of an operation performed by a slave unit in response to a timing signal transmitted by a master unit in this embodiment of the control system according to the present invention and a conventional control system.
Figure 10:
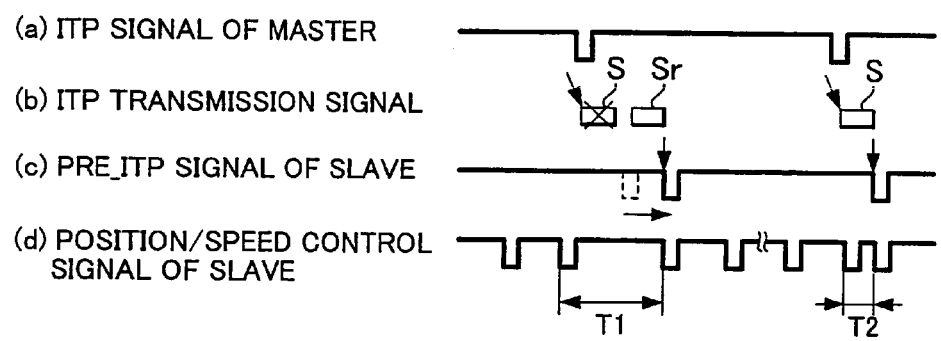
FIG. 10 is a timing chart of an operation performed in a conventional control system when a communication irregularity occurs.

FIG. 8 is an illustrative view of an operation performed when the correcting means shown in FIG. 5 are used, and "−2" is set in the shift setting register 11 to correct a transmission path delay or the like. Likewise in this case, it is assumed that no deviation exists between the PRE_ITP signal of the slave unit, which is generated on the basis of the ITP signal issued by the master unit, and the corrected ITP signal unique to the slave unit, such that the phase difference is "0" and "0" is set in both the period modification register 13 and period modification counter 21 (n=0).

In this condition, the ITP signal is generated after the ITP signal interval reference value of k clocks such that the phase difference between the ITP signal and PRE_ITP signal is "0". The adder 14 then adds together the value "−2" of the shift setting register 11, the output (phase difference) "0" of the phase comparator 12, and the value "0" of the period modification register 13, whereby an added value of "−2" is loaded into the period modification counter 21. Further, the filter 15 loads the moving average "−1" of the previous output "0" and the current output "−2" of the adder 14 into the period modification register 13 (n=1).

By loading "−2" into the period modification counter 21, the ITP signal is generated two clocks earlier, and the PRE_ITP signal is delayed by +2 clocks from the ITP signal. Therefore, a phase difference of "+2" is outputted from the phase comparator 12. As a result, the adder 14 adds together the value "−2" of the shift setting register 11, the value "−1" of the period modification register 13, and the output (phase difference) "+2" of the phase comparator 12, whereby an added value of "−1" is loaded into the period modification counter 21. Further, the filter 15 loads the moving average "−1" of the previous output "−2" and the current output "−1" of the adder 14 into the period modification register 13 (n=2).

At the generation point of the next (n=3) ITP signal, the ITP signal is generated one clock earlier than the ITP signal interval reference value k, and therefore the PRE_ITP signal is delayed by a total of +3 clocks. Accordingly, a phase difference of "+3" is outputted from the phase comparator 12. As a result, the adder 14 adds together the value "−2" of the shift setting register 11, the value "−1" of the period modification register 13, and the output (phase difference) "+3" of the phase comparator 12, whereby an added value of "0" is loaded into the period modification counter 21. The moving average "0" of the previous output "−1" and the current output "0" of the adder 14 is loaded into the period modification register 13 (n=3).

At the generation point of the next (n=4) ITP signal, the ITP signal is generated at an interval of the reference value k, and hence there is no change in the PRE_ITP signal delay in relation to the ITP signal. Accordingly, the PRE_ITP signal remains delayed by a total of +3 clocks, and a phase difference of "+3" is outputted from the phase comparator 12. As a result, the adder 14 adds together the value "−2" of the shift setting register 11, the value "0" of the period modification register 13, and the output (phase difference) "+3" of the phase comparator 12, whereby an added value of "+1" is loaded into the period modification counter 21. The moving average "0" of the previous output "0" and the current output "+1" of the adder 14 is loaded into the period modification register 13 (n=4).

At the generation point of the next (n=5) ITP signal, the ITP signal is generated one clock later than the reference value k, and therefore the PRE_ITP signal is delayed by a total of +2 clocks. Accordingly, a phase difference of "+2" is outputted from the phase comparator 12. As a result, the adder 14 adds together the value "−2" of the shift setting register 11, the value "0" of the period modification register 13, and the output (phase difference) "+2" of the phase comparator 12, whereby an added value of "0" is loaded into the period modification counter 21. The moving average "0" of the previous output "+1" and the current output "0" of the adder 14 is loaded into the period modification register 13 (n=5).

At the generation point of the next (n=6) ITP signal, the ITP signal is generated after the reference value k clocks, and therefore the PRE_ITP signal is delayed by a total of +2 clocks. Accordingly, a phase difference of "+2" is outputted from the phase comparator 12. As a result, the adder 14 adds together the value "−2", of the shift setting register 11, the value "0" of the period modification register 13, and the output (phase difference) "+2" of the phase comparator 12, whereby an added value of "0" is loaded into the period modification counter 21. The moving average "0" of the previous output "+1" and the current output "0" of the adder 14 is loaded into the period modification register 13 (n=6).

Hence, from n=5 onward, the unique ITP signal generated by the slave unit is generated two clocks earlier than the PRE_ITP signal, the delay "−2" set in the shift setting register 11 and caused by the transmission path or the like is canceled out, and the unique ITP signal generated by the slave unit is generated in synchronization with the ITP signal of the master unit.

In the embodiment shown in FIG. 5, the filter is arranged just before the period modification register, but the value outputted from the adder may be once loaded and stored to be carried out filtering processing in the period modification register.

Note that the above description deals with operations and actions of the correcting means when a timing signal deviation caused by a communication irregularity occurs and when a timing signal delay caused by the communication path length and so on occurs. Although description thereof has been omitted, a timing signal deviation due to overlapping, simultaneous delays caused by both a communication irregularity and the communication path length can be corrected in a similar manner.

The invention claimed is:

1. A control system, comprising:
    a single control apparatus serving as a master unit and one or more control apparatuses serving as slave units connected by a serial bus; and
    motors respectively and synchronously controlled by different control apparatuses,
    wherein each slave unit has a correcting unit which obtains a correction amount for aligning a slave timing signal generated by said slave unit, with a master timing signal transmitted by said master unit and received by said slave unit, and which corrects said slave timing signal in accordance with said correction amount, whereupon said slave timing signal corrected by said correcting unit is output to the motors controlled by said slave unit, said correcting unit including
        a phase comparator for determining said phase difference between said master timing signal transmitted by said master unit and received by said slave unit, and said slave timing signal generated and outputted by said slave unit,
        a period modification register,
        correction amount generating unit having an adder to obtain said correction amount by adding together an output of said phase comparator and a value stored in said period modification register, and
        signal generating unit to correct a timing signal generation period of said slave timing signal based on said correction amount generated by said correction amount generating unit, and generating said slave timing signal.

2. The control system according to claim 1, wherein said control apparatuses serving as said slave units include an axis control board mounted in an expansion slot of said master unit.

3. The control system according to any one of claims 1 or 2, wherein:
    said correction amount generating unit further comprises a shift setting register in which a value for correcting a timing signal transmission delay from said master unit to said slave unit is set, and
    said adder obtains said correction amount by adding together said output of said phase comparator, said value stored in said period modification register, and said value of said shift setting register.

4. The control system according to claim 3, wherein said correction value, which is the output of said adder, is loaded into said period modification register to update said period modification register.

5. The control system according to claim 3, wherein said correction amount generating unit further comprises a filter, and said correction amount is determined in accordance with a plurality of added values outputted from said adder, a plurality of phase differences outputted from the phase comparator, or a plurality of values stores in said period modification register.

6. The control system according to claim 3, wherein said signal generating unit has a period modification counter and a timer,
    a correction value, which is the output of said adder, is loaded into said period modification counter,
    a period modification command and a sign signal of said loaded correction value are outputted to said timer until a number of position/speed control period signals outputted from said timer matches said value loaded in said counter, and
    said timer corrects a reference time period using said inputted period modification command and sign signal, outputs said position/speed control period signal, and outputs said timing signal every time said position/speed control period signal reaches a predetermined number.

* * * * *

UNITED STATES PATENT AND TRADEMARK OFFICE
CERTIFICATE OF CORRECTION

PATENT NO. : 7,432,674 B2
APPLICATION NO. : 11/366432
DATED : October 7, 2008
INVENTOR(S) : Kazunari Aoyama et al.

It is certified that error appears in the above-identified patent and that said Letters Patent is hereby corrected as shown below:

FIG. 2 (Block 20) change "TCOMD" to --TCMD--.

FIG. 5 (Block 20) change "TCOMD" to --TCMD--.

Column 3, Line 63, change "a" to --an--.

Column 5, Line 39, change "soon." to --so on.--.

Column 6, Line 16, change "aperiodic" to --a periodic--.

Column 12, Line 12, after "of" insert --the--.

Signed and Sealed this

Third Day of March, 2009

JOHN DOLL
*Acting Director of the United States Patent and Trademark Office*

UNITED STATES PATENT AND TRADEMARK OFFICE
CERTIFICATE OF CORRECTION

PATENT NO.       : 7,432,674 B2
APPLICATION NO.  : 11/366432
DATED            : October 7, 2008
INVENTOR(S)      : Kazunari Aoyama et al.

It is certified that error appears in the above-identified patent and that said Letters Patent is hereby corrected as shown below:

Column 12, Line 12, after "of" delete "the".

Signed and Sealed this

Twenty-first Day of April, 2009

JOHN DOLL
*Acting Director of the United States Patent and Trademark Office*